May 6, 1969 W. RINDNER ET AL 3,443,165

PIEZOJUNCTION DEVICE WITH AN ENCAPSULATING P-N JUNCTION

Filed Nov. 14, 1963

INVENTORS
WILHELM RINDNER
ROGER F. NELSON

BY Donald Brown
AGENT

United States Patent Office 3,443,165
Patented May 6, 1969

3,443,165
PIEZOJUNCTION DEVICE WITH AN ENCAPSULATING P-N JUNCTION

Wilhelm Rindner, Lexington, Mass., and Roger F. Nelson, Mountain View, Calif., assignors to Raytheon Company, Lexington, Mass., a corporation of Delaware Filed Nov. 14, 1963, Ser. No. 323,621
Int. Cl. H01l 3/00
U.S. Cl. 317—234 6 Claims This invention relates to semiconductor devices and, more particularly, to semiconductor devices having a junction therein to which a localized strain is applied in order to alter the magnitude of the resistance exhibited between two terminals of said device.

This invention further relates to semiconductor devices of the aforementioned type having one region or zone of semiconductor material completely enclosing or encapsulating a second region or zone of semiconductor material.

The term junction as used herein is intended to include, also the boundary between a P and N region or zone or an N or P region and an intrinsic region. Additionally, the term junction, as utilized herein, is intended to include the boundary between an N region and an N+ region, and that between a P region and a P+ region as well as any combination of P, N, I, P+ and N+ which results in an electrical conductivity barrier between any two such adjoining regions.

The term semiconductor material, as utilized herein, is considered generic to germanium, silicon, and germanium-silicon alloy, silicon carbide and compounds such as indium-antimonide, gallium-antimonide, aluminum-antimonide, indium-arsenide, zinc sulfide, gallium-arsenide, gallium-phosphorus alloys, organic alloys, and indium-phosphorus alloys and the like.

The term active impurity is used to denote those impurities which affect the electrical rectification characteristics of semiconductor materials as distinguished from other impurities which have no appreciable affect upon these characteristics. Active impurities are ordinarily classified as donor (N) type impurities such as phosphorous, arsenic, and antimony, or acceptor (P) type impurities such as boron, aluminum, gallium and indium.

It is a primary object of the invention to provide a semiconductor device which exhibits large resistance changes in accordance with a strain applied to a junction of the device.

It is an additional object of this invention to provide a semiconductor device having at least two parallel current paths therein.

It is a further object of this invention to provide a multiregion semiconductor device which only requires connections to a single region of said semiconductor device.

It is an additional object to provide a new and useful strain transducer exhibiting large impedance changes in accordance with the magnitude of a strain applied to said transducer.

It is still another object of this invention to provide a semiconductor device having one region completely enclosed and encapsulated by a second region, thereby providing maximum protection of a junction therein.

In accordance with this invention, a first region of semiconductor material is covered, at least in part, by a second region of semiconductor material. Electrical connections are made solely to one of the regions of semiconductor material. A small volume of a barrier or junction lying between said regions is strained, such as by a pointed member adjacent to the junction. Straining the barrier reduces the resistance of the barrier and thue effectively parallels the resistances exhibited by said first and second regions thereby providing large variations in the magnitude of resistance exhibited between said connections.

An additional embodiment illustrates a strain transducer comprised of a first region of semiconductor material completely surrounded and enclosed by a second region of semiconductor material. Electrical connections are made solely to the outer enclosing region. A stress is applied to the outer region in order to strain a junction between said first and second regions.

Other objectives and features of this invention will become apparent from the following descriptions taken in conjunction with the following drawings wherein.

Figures 1, 4:
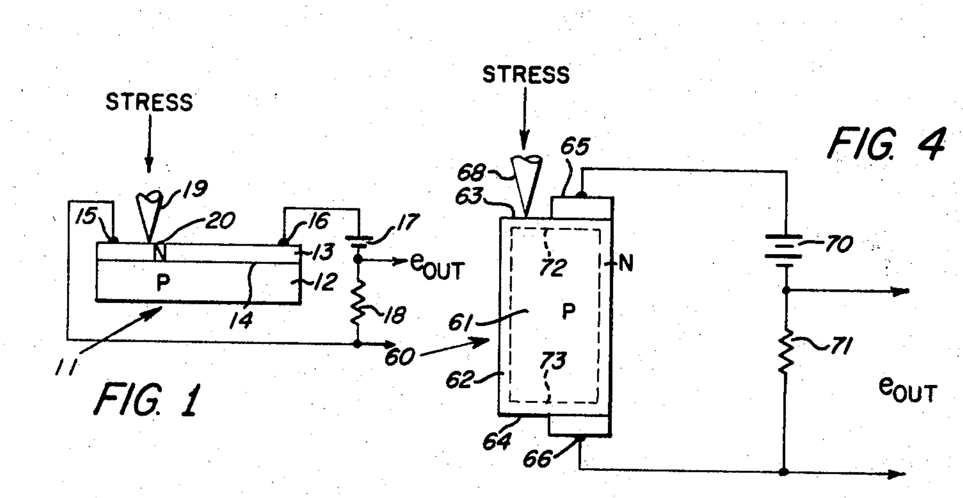
FIG. 1 is a front elevation of a semiconductor device according to this invention in circuit.
FIG. 4 is a plan view of a strain transducer, in accordance with this invention, having an unexposed junction.

Referring now to FIG. 1, there is disclosed a semiconductor strain transducer device 11, said device being comprised of a first P region of silicon semiconductor material 12 having mounted thereon a second N region of silicon semiconductor material 13. A junction 14 is formed between said first and second regions. Electrical contacts are made to said second region at 15 and 16, respectively. A battery 17 providing, for example, one volt and a resistance 18 of, for example, ten ohms is connected between terminals 15 and 16, respectively. A stress applying member 19 having a small radius of curvature surface or tip bearing on surface 20 of region 13 is shown for producing a non-uniform, anisotropic strain confined to a small volume of junction or barrier 14. It has been discovered in copending United States patent applications S.N. 183,940, filed on Mar. 30, 1962 and S.N. 261,065, filed on Feb. 26, 1963, by Wilhelm Rindner and assigned to the assignee of this invention, that stresses applied by members having a bearing surface with a radius of curvature less than 250 microns produce a strain confined to a small volume of a shallow junction, said strain then producing magnitudes of improvement in sensitivity in comparison to other presently available strain sensitive devices. It is believed that this effect is due to the confinement of the strain within the junction to an extremely small volume, said volume being in the order of interatomic molecular dimensions.

For purposes of explanation, the preferred embodiment shown in FIG. 1 has a region 12 which has a total resistance significantly lower than the total resistance of region 13. The battery 17 produces a reverse biasing of junction 14 and an increase in the potential barrier in the vicinity of contact 15 and simultaneously forward biases the junction in the vicinity of contact 16. By applying a stress in the order of grams with a member 19, where the junction 14 is reversed biased, to produce a strain confined to a small volume of junction 14, a current, which had been previously flowing through the higher resistance region 13 between contacts 15 and 16 will, on the application of a sufficiently high magnitude of stress, be caused to increase upon the straining of the junction 14. When junction 14 is strained, the current, which had been previously flowing primarily through region 13, will then take the path of least resistance; that is, through region 12 and back to contact 16. Thus, in effect, we have a paralleling of regions 12 and 13. The resistance of the parallel regions 12 and 13 being substantially equal to the resistance of region 13 when the strain applied to the junction 14 is below a predetermined magnitude. Upon the application of a stress, which produces an increased strain in the junction 14, a significant increase in current will be exhibited between contacts 15 and 16 due to the paralleling of low resistance region 12 with the high resistance region 13 and the altering of the affect of resistance presented by the potential barrier of the junction. Thus, applicant has provided a device which will exhibit a high resistance between contacts made solely to one region of semiconductor material and will exhibit significant change in resistance between said contacts upon the application of a significant strain to said junction. Although the stress is shown being applied to the reversed biased junction, changes in resistance can be obtained by also stressing the forward biased junction.

Figures 2, 5:
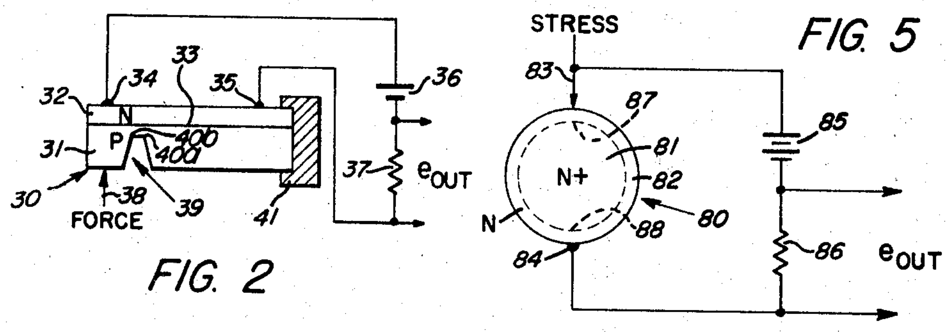
FIG. 2 is a front elevation view of another embodiment of a semiconductor device in accordance with this invention having a strain transmitting notch therein.
FIG. 5 is a plan view of a spherically shaped strain transducer having an unexposed junction therein.

Referring now to FIG. 2, there is disclosed a notched embodiment of the semiconductor device in accordance with this invention. The notched semiconductor device or strain transducer 30 is comprised of a first P region of semiconductor material 31 mounted on a second N-type region of semiconductor material 32. These two regions are mounted in an insulating support 41. A strain transmitting notch 39 is shown formed in a P region 31. Notch 39 has two strain transmitting corners 40*a* and 40*b*. Disposed between the two regions is a strain sensitive junction 33. Contacts are made to the N region by contacts 34 and 35. Connected between these contacts is a battery 36 and a resistance 37. A force, represented by arrow 38, is shown for producing a bending or twisting movement so that transducer 30 moves about its fixed end which is mounted in support 41. This device operates similarly to that of FIG. 1. By applying a sufficiently large force, the strain transmitting corners 40*a* and 40*b* produce a strain or dislocation in the junction or barrier 33, thereby lowering the parallel resistance of transducer 30 between contacts 34 and 35. Thus, significant changes in current flowing through this device can be produced in accordance with the magnitude of force applied which produces a strain in the junction 33.

Figures 3, 6:
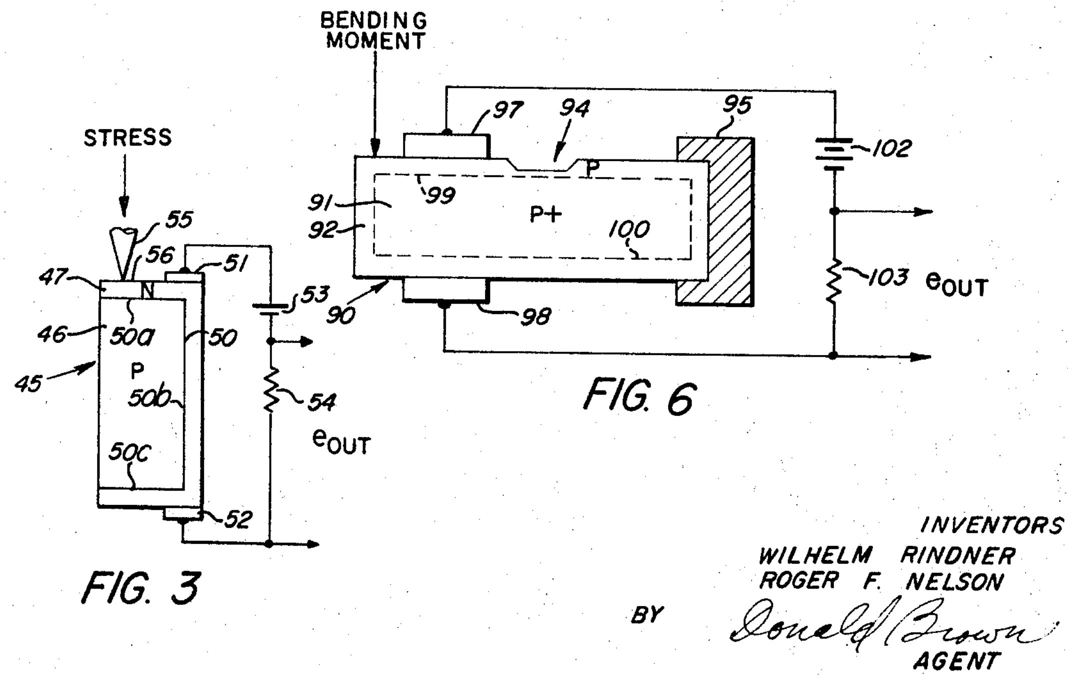
FIG. 3 is a front elevation view of another embodiment of this invention showing a first region of semiconductor material surrounded on three sides by a second region of semiconductor material.
FIG. 6 is a plan view of a notched strain transducer having an unexposed junction therein in a cantilever configuration.

In FIG. 3, there is shown an additional embodiment in accordance with this invention showing a first region of semiconductor material surrounded on three sides by a second region of semiconductor material. This device 45 is comprised of a first P region of material 46 in a rectangular shape. An N-type region 47 of semiconductor material forms a junction along three sides of the rectangular block 46. Contacts are made to this device at ohmic junctions 51 and 52, respectively. A stress is applied by a pointed device 55, such as a stylus, having a radius of curvature in the order of less than about 250 microns. This member bears upon a surface 56 so as to produce a strain confined to a small volume of a junction 50 between said regions of material. Coupled to the ohmic junctions 51 and 52 is a battery 53 and a resistance 54. The battery 53 reverse biases a portion of junction 50, shown as 50*a*, and forward biases a portion of junction 50, shown as 50*c*. The portion of junction 50, shown in the diagram, is reverse biased for approximately half its length and then becomes forward biased for the remainder of its length. By applying a stress, as shown in FIG. 3, current flowing through the device 45 can be varied in accordance with the magnitude of a strain applied to a junction.

Referring now to FIG. 4, there is disclosed a plan view of a strain transducer 60. A block or region 61 of rectangularly shaped P doped semiconductor material is covered completely or encapsulated by a thin diffused N-type skin region 62. The thin diffused skin 62 is formed by conventional techniques, such as diffusion or vapor deposition. Electrodes 65 and 66 are formed on surfaces 63 and 64, respectively. These electrodes could be formed by vacuum evaporation techniques and a subsequent alloying step to form an ohmic contact with the N-type skin region 62. These electrodes are coupled to a battery 70 and a resistor 71. The battery 70 is poled in such a manner that junction or barrier 72 under surface 63 is in a reversed bias condition and a junction or barrier 73, disposed below surface 64, is in a forward conduction condition. It has been discovered in the two aforementioned copending applications that, junctions lying at depths less than .010 inch from a surface to which there is applied a stress, provides the best results. A stress in FIG. 4 is applied by a diamond stylus 68 having a point which bears upon the surface 63 in a manner so as to produce a strain within and confined to a small volume of the junction 72. A device for applying this pressure is disclosed in FIG. 1 of the first two mentioned copending applications. It has been discovered that a tip, having a radius of curvature less than about 250 microns, provides acceptable results but it has also been discovered that reduction in the dimension, that is the radius of curvature dimension of the tip 68 to a radius in the order of about 15 to 20 microns, produces the best observed results.

The device of FIG. 4 operates in the following manner: as long as the stress applied to the surface 13 by the object 68 is small, most of the current between the electrodes 65 and 66 will flow through the diffused skin region 62 rather than through the block 61 due to the potential barrier existing at the junction 72. A rough estimate of the skin resistance, assuming as an example the skin depth of 0.2 micron of 1 ohm per centimeter, a length of 100 microns and a cross section of $20\times20$ microns, by simple arithmetic leads to a skin resistance of 67,000 ohms. Since the reversed biased junction 72 has a considerably higher resistance than the 67,000 ohm value, the resistance of transducer 60 will essentially be that exhibited by the skin. When the stress applied to the surface 63, by the tipped device 68 and increased to a significant amount, the resistance of the reversed biased junction 72 can be reduced to a low value, approximately 10,000 ohms, thus the skin 62 and the block region 61, which are substantially in a parallel relationship, will produce significant changes in resistance and will substantially be equal to approximately 10,000 ohms, which is the resistance of the block region 61 when a significant stress applied to surface 63 produces a strain in a small volume of the junction 72. The output of this device is taken across resistance 71.

Thus, the strain transducer junction structures are provided which not only have no exposed junction whatever, but also can be fabricated simpler and cheaper than most other junction devices. Additionally, these unexposed junction devices protect the junction from contamination which is generally known to cause drifting and deterioration of semiconductor operating characteristics. In addition, use of an unexposed junction strain transducer device prevents contamination or degradation during subsequent portions of the manufacturing process, such as connecting electrodes. Furthermore, a device of this type permits a strain transducer to be constructed having only the outer exposed surface region connected externally in order to utilize this device in a circuit configuration.

In FIG. 5, there is a plan view of a spherical configuration of the device in FIG. 4. The spherical transducer 80 is comprised of an N+ region 81 completely encapsulated by a spherical N-type skin region 82. Contact to device 80 is made by ohmic junction 84 and by a metallic object 83 which bears on a surface of the skin region 82 at a spaced apart relationship from ohmic contact 84. Pointed object 83 is, in this instance, metallic so as to provide a means for making ohmic contact to the device 80. Pointed object 83 is coupled to battery 85 and ohmic contact 84 is coupled to resistance 86. Resistance 86 and 85 are coupled together. An output is obtained across resistance 86. Battery 85 provides a reverse biasing to portion 87 to a junction or barrier formed between the skin region 82 and the inner region 81. Additionally, the battery forward biases portion 88 of the same junction. By applying a stress to a surface of the skin region 82, the junction portion 87 is strained and accordingly produces a change in current flow through the circuit in the same manner as described with regard to FIG. 4.

FIG. 6 is another embodiment of a strain transducer without an exposed junction but includes a notch 94 for producing a strain within the junction separating regions of semiconductor materials. The strain transducer 90 of FIG. 6 comprises an inner P+ type region 91 surrounded by a P-type region 92. Electrodes 97 and 98 ohmically couple transducer 90 to a battery 102 and a resistance 103. One end of transducer 90 is mounted in an insulating support 95 so as to permit transducer 90 to bend in a cantilever manner. The notch 94 is formed in the skin region 92, either by cutting or scribing an etching with a preferential etchant. A stress or bending moment is applied by an arrow shown in FIG. 6 in a manner so as to produce bending or twisting of a transducer 90, thereby causing a strain to be transmitted to the junction shown as 99. The battery 102 is poled in such a manner so as to reverse bias the junction 99 between the regions 91 and 92 and forward bias the junction 100 between the regions 91 and 92. Variations in stress which produce variations in the strain due to the bending or twisting of the notch 94, will produce fluctuations in the signal output across resistance 103. In this manner, an output signal, representative of the stress applied by the arrow, is obtained.

Although the devices of this invention have been disclosed with particular reference to the aforementioned semiconductor material types, other types of semiconductor materials could be utilized. Accordingly, it is desired that this invention not be limited except as defined by the appended claims.

What is claimed is:

1. A strain transducer diode device comprising a first region of semiconductor material, a second region of semiconductor material of different conductivity characteristics completely encapsulating said first region, said device having a barrier therein located between said first and second regions, a first ohmic connection to a surface of said second region, a second ohmic connection to a surface of said second region at a distance spaced apart from said first ohmic connection, and means for stressing said second region to produce a strain in said barrier.

2. A device in accordance with claim 1 wherein said means includes a pointed stylus bearing on a surface of said second region to produce a strain in said barrier and to thereby vary the parallel resistance of the device between said ohmic connections.

3. A strain transducer diode device comprising a first region of semiconductor material, a second region of semiconductor material of different conductivity characteristics completely encapsulating said first region, said device having a barrier therein located between said first and second regions, a first ohmic connection to a surface of said second region, a second ohmic connection to a surface of said second region at a distance spaced apart from said first ohmic connection, means for biasing a portion of said barrier, and means for producing a strain within said barrier, said device exhibiting a change in resistance varying substantially between the resistance of said second region and the resistance of said first region in accordance with the magnitude of strain produced by said means for producing a strain within said barrier.

4. A strain transducer diode device as set forth in claim 3 wherein said means for producing a strain in said barrier comprises a pointed stylus bearing on said second surface.

5. A strain transducer diode device as set forth in claim 3 wherein said means for producing a strain in said barrier comprises a notch extending through the second region from the surface thereof to a point adjacent but not crossing said barrier.

6. A strain transducer diode device as set forth in claim 1 wherein said means for producing a strain comprises a notch between said contacts and extending through the second region from the surface thereof to a point adjacent but not crossing said barrier.

References Cited

UNITED STATES PATENTS

| | | | |
|---|---|---|---|
| 3,049,685 | 8/1962 | Wright | 338—2 |
| 3,132,408 | 5/1964 | Pell | 29—25.35 |
| 3,160,844 | 12/1964 | McLellan | 338—4 |

OTHER REFERENCES

Sanchez, Jr.: Semiconductor Strain Gauges, I.S.A. Journal, vol. 9, No. 5, May 1962 (pp. 38–40) 317–235.

JOHN W. HUCKERT, *Primary Examiner.*

M. EDLOW, *Assistant Examiner.*

U.S. Cl. X.R.

179—121; 317—235